(12) United States Patent
Akashi et al.

(10) Patent No.: US 9,269,913 B2
(45) Date of Patent: Feb. 23, 2016

(54) THIOLATE-BRIDGED MULTINUCLEAR COPPER(I) COMPLEX

(71) Applicants: SAMSUNG DISPLAY CO., LTD., Yongin-City, Gyeonggi-Do (KR); National University Corporation Hokkaido University, Hokkaido Sapporo-shi, Hokkaido (JP)

(72) Inventors: Nobutaka Akashi, Yokohama (JP); Masako Kato, Sapporo (JP); Atsushi Kobayashi, Sapporo (JP); Kotaro Shimada, Sapporo (JP); Hiroki Ohara, Sapporo (JP)

(73) Assignees: SAMSUNG DISPLAY CO., LTD., Yongin, Gyeonggi-do (KR); NATIONAL UNIVERSITY CORPORATION HOKKAIDO UNIVERSITY, Sapporo-shi, Hokkaido (JP)

( * ) Notice: Subject to any disclaimer, the term of this patent is extended or adjusted under 35 U.S.C. 154(b) by 0 days.

(21) Appl. No.: 14/323,270

(22) Filed: Jul. 3, 2014

(65) Prior Publication Data

US 2015/0011765 A1    Jan. 8, 2015

(30) Foreign Application Priority Data

Jul. 4, 2013   (JP) .................. 2013-140337

(51) Int. Cl.
| | | |
|---|---|---|
| C07F 1/08 | (2006.01) | |
| C07F 9/06 | (2006.01) | |
| H01L 51/00 | (2006.01) | |
| C09K 11/06 | (2006.01) | |
| H01L 51/50 | (2006.01) | |

(52) U.S. Cl.
CPC ............ *H01L 51/0091* (2013.01); *C09K 11/06* (2013.01); *C09K 2211/188* (2013.01); *H01L 51/5016* (2013.01)

(58) Field of Classification Search
USPC ......................................... 546/2, 10; 556/21
See application file for complete search history.

(56) References Cited

FOREIGN PATENT DOCUMENTS

| JP | 2007-308499 | | 11/2007 |
|---|---|---|---|
| JP | 2009516390 | A | 4/2009 |
| JP | 2010515676 | A | 5/2010 |
| JP | 2012516831 | A | 7/2012 |
| WO | WO-2006101276 | A1 | 9/2006 |

OTHER PUBLICATIONS

Dance, I.G. et al.: Preparation, distorted step structure, and topological analysis of (SPh)2 (CuPPh3)4 (tol)2. Inorganic Chem., vol. 24, pp. 2547-2550, 1985.*
Howell, J.A.S.: Structure and bonding in cyclic thiolate complexes of copper, silver and gold. Polyhedron, vol. 25, pp. 2993-3005, 2006.*
P. Fernandez, Synthesis and Structural Characterization of Colbalt, Nickel and Copper Phosphanylthiolato Complexes, Eu. J. Inorg. Chem 2010, pp. 814-823.

* cited by examiner

*Primary Examiner* — Charanjit Aulakh
(74) *Attorney, Agent, or Firm* — Lee & Morse, P.C.

(57) ABSTRACT

A copper(I) complex is represented by the following Formula (1): $[Cu_a(XS)_b(L)_c]$, wherein, L is triphenylphosphine, acetonitrile, tri-iso-butylphosphine, or a substituted or unsubstituted heterocyclic compound having 5 to 18 carbon atoms, a is an integer from 2 to 6, b is an integer from 2 to 6, c is an integer from 0 to 6, X is a substituted or unsubstituted aryl group, substituted or unsubstituted carbazole, or $PR_3$, where R is a substituted or unsubstituted phenyl group or a substituted or unsubstituted cyclohexyl group.

4 Claims, 4 Drawing Sheets

FIG. 1

$C_{76}H_{62}Cu_4N_2P_4S_4$ triclinic, $P$-1

$a$=14.440(3), $b$=15.33(2), $c$=15.49(2) Å, $\alpha$=102.706(8), $b$=107.33(1), $g$=116.74(1), $V$=2658.8 Å3 $R$1=6.7%

(L=$CH_3CN$)

Bond length [Å]
Cu1⋯Cu2   2.772
Cu1-S5    2.574
Cu1-S6    2.269
Cu1-S7    2.325
Cu1-P9    2.261
Cu3-S7    2.344
Cu3-S8    2.277
Cu3-P10   2.235

FIG. 2

$C_{108}H_{84}Cu_6P_6S_6$ triclinic, $P$-1

$a$=9.617(2), $b$=11.262(3), $c$=17.690(5) Å, $α$=75.49(1), $β$=71.82(1)
$γ$=69.64(1), $V$=1684.73 Å3, $R$1=5.67%

| Bond length [Å] | |
|---|---|
| Cu1···Cu2 | 2.877 |
| Cu1-S5 | 2.292 |
| Cu1-S6 | 2.494 |
| Cu1-S7 | 2.299 |
| Cu1-P9 | 2.229 |
| Cu3-S7 | 2.201 |
| Cu3-S8 | 2.258 |
| Cu3-P10 | 2.249 |

FIG. 3 formula:$C_{76}H_{66}Cu_2P_4S_2$, crystal system: monoclinic, space group:$P2_1/c$
$a$=9.133(4) Å, $b$=18.331(8) Å, $c$=20.479(8) Å, $a$=90°, $b$=93.637(6)°, $g$=90°,
$V$=3421.63 Å³, $R-Factor$=6.12%

FIG. 4

THIOLATE-BRIDGED MULTINUCLEAR COPPER(I) COMPLEX

CROSS-REFERENCE TO RELATED APPLICATION

Japanese Patent Application No. 2013-140337, filed on Jul. 4, 2013, in the Japanese Patent Office, and entitled: "Thiolate-Bridged Multinuclear Copper(I) Complex," is incorporated by reference herein in its entirety.

BACKGROUND

1. Field

Embodiments relate to a copper(I) complex, and more particularly, to a thiolate-bridged multinuclear copper(I) complex bridged by sulfur.

2. Description of the Related Art

In recent years, organic electroluminescence (EL) displays that are one type of image displays have been actively developed. Unlike a liquid crystal display and the like, the organic EL display is a self-luminescent display in which holes and electrons injected from a positive electrode and a negative electrode are recombined in an emission layer to thus emit light from a light-emitting material including an organic compound of the emission layer, thereby providing a display.

An example of an organic electroluminescence device (hereinafter referred to as an organic EL device) t is an organic EL device that includes a positive electrode, a hole transport layer disposed on the positive electrode, an emission layer disposed on the hole transport layer, an electron transport layer disposed on the emission layer, and a negative electrode disposed on the electron transport layer. Holes injected from the positive electrode are injected into the emission layer via the hole transport layer. Electrons are injected from the negative electrode, and then injected into the emission layer via the electron transport layer. The holes and the electrons injected into the emission layer are recombined to generate excitons within the emission layer. The organic EL device emits light generated by the radiation and deactivation of the excitons.

SUMMARY

Embodiments are directed to a copper(I) complex represented by following Formula (1):

$$[Cu_a(XS)_b(L)_c] \qquad (1)$$

where, L is triphenylphosphine, acetonitrile, tri-iso-butylphosphine, or a substituted or unsubstituted heterocyclic compound having 5 to 18 carbon atoms, a is an integer from 2 to 6, b is an integer from 2 to 6, c is an integer from 0 to 6, X is a substituted or unsubstituted aryl group, substituted or unsubstituted carbazole, or $PR_3$, where R is a substituted or unsubstituted phenyl group or a substituted or unsubstituted cyclohexyl group.

In Formula (1), c may be an integer from 1 to 6, and the heterocyclic compound having 5 to 18 carbon atoms may be a nitrogen-containing heterocyclic compound having 5 to 18 carbon atoms.

In Formula (1), the nitrogen-containing heterocyclic compound having 5 to 18 carbon atoms may be a compound represented by Formulae (2) to (14):

(2)

(3)

(4)

(5)

(6)

(7)

(8)

(9)

(10)

(11)

(12)

(13)

(14)

In Formula (1), L may be pyridine, a may be 2, b may be 2, c may be 2, and X may be triphenylphosphine.

In Formula (1), L may be acetonitrile, a may be 4, b may be 4, c may be 2, and X may be triphenylphosphine.

In Formula (1), a may be 6, b may be 6, c may be 0, and X may be triphenylphosphine.

The copper(I) complex may be selected from Compounds 1 to 17 (illustrated below).

BRIEF DESCRIPTION OF THE DRAWINGS

Features will become apparent to those of skill in the art by describing in detail exemplary embodiments with reference to the attached drawings in which.

DETAILED DESCRIPTION

Example embodiments will now be described more fully hereinafter with reference to the accompanying drawings; however, they may be embodied in different forms and should not be construed as limited to the embodiments set forth herein. Rather, these embodiments are provided so that this disclosure will be thorough and complete, and will fully convey exemplary implementations to those skilled in the art.

Embodiments are directed to a multinuclear metal complex including a plurality of copper(I) atoms, a copper(I) complex having a stable structure that may be obtained by bridging the plurality of copper(I) atoms using sulfur (S). Hereinafter, a thiolate-bridged multinuclear copper(I) complex will be explained. The thiolate-bridged multinuclear copper(I) complex may, however, be embodied in different forms.

The thiolate-bridged multinuclear copper(I) complex may be a copper(I) complex represented by the following Formula (1).

$$[Cu_a(XS)_b(L)_c]$$ (1)

In Formula (1), L may be triphenylphosphine (PPh$_3$), acetonitrile (CH$_3$CN), tri-iso-butylphosphine (P(i-Bu)$_3$), or a substituted or unsubstituted heterocyclic compound having 5 to 18 carbon atoms, a may be an integer from 2 to 6, b may be an integer from 2 to 6, c may be an integer from 0 to 6, X may be a substituted or unsubstituted aryl group, substituted or unsubstituted carbazole, or PR$_3$, and R may be a substituted or unsubstituted phenyl group or a substituted or unsubstituted cyclohexyl group.

The thiolate-bridged multinuclear copper(I) complex may be a multinuclear complex having a plurality of copper(I) atoms as nuclei. The number of the central metal, i.e., the copper atom, in the thiolate-bridged multinuclear copper(I) complex (a in Formula (1)) may be from 2 to 6.

In the thiolate-bridged multinuclear copper(I) complex, bridges may be formed between copper(I) atoms by S. The S forming the bridge has three unshared electron pairs. Accordingly, various bonding modes including a single bond to a multi-bond may be possible, such that a cluster may be formed. According to embodiments, S may be included in the bridging of a ligand, and a cluster of 2 to 6 nuclei of copper(I) atoms may be easily provided. In addition, S is smaller than bridging atoms in commonly formed halogen-bridged metal complexes. Accordingly, a more compact cluster may be formed, and various multinuclear clusters may be formed. In the copper(I) complex, a copper atom and another copper atom may be bridged through S. Accordingly, the structure of the complex may be stabilized even more.

In the above Formula (1), in the case that X includes phosphorus (P), a ligand coordinated with the copper(I) may be a chelate ligand including P and S as the ligands. A more stable complex having great affinity with copper(I), which is a weak Lewis acid, may be formed.

As described above, the thiolate-bridged multinuclear copper(I) complex may be a structure having excellent stability. The thiolate-bridged multinuclear copper(I) complex may be appropriately used as a phosphorescent emission material in an emission layer of an organic EL device.

In Formula (1), the heterocyclic compound having 5 to 18 carbon atoms may be a nitrogen-containing heterocyclic compound having 5 to 18 carbon atoms. In Formula (1), in the case that L is the heterocyclic compound having 5 to 18 carbon atoms and nitrogen, the emission wavelength may be changed by the lowering of the energy level of a π* orbital. As example, the heterocyclic compound having 5 to 18 carbon atoms and nitrogen may be at least one of the compounds represented by the following Formulae (2) to (14).

(2)

(3)

(4)

(5)

(6)

(7)

(8)

(9)

(10)

(11)

(12)

(13)

(14)

As an example, in the thiolate-bridged multinuclear copper(I) complex represented by Formula (1), L may be pyridine, a may be 2, b may be 2, c may be 2, and X may be triphenylphosphine. The thiolate-bridged multinuclear copper(I) complex having the above-described configuration may control the wavelength of emitted light.

As an example, in the thiolate-bridged multinuclear copper(I) complex represented by Formula (1), L may be acetonitrile, a may be 4, b may be 4, c may be 2, and X may be triphenylphosphine. In the thiolate-bridged multinuclear copper(I) complex having the above configuration, the acetonitrile may be easily exchanged for another ligand. This thiolate-bridged multinuclear copper(I) complex may be appropriately used as a starting material to form another thiolate-bridged multinuclear copper(I) complex having 4 nuclei copper(I) atoms as a skeleton.

As an example, in the thiolate-bridged multinuclear copper(I) complex represented by Formula (1), a may be 6, b may be 6, c may be 0, and X may be triphenylphosphine. The thiolate-bridged multinuclear copper(I) complex having the above configuration includes a flexible 6 nuclei core of copper(I) and a structure with a 2 nuclei core at the center portion thereof. Such a structure may allow the wavelength of emitted light to be controlled by controlling emission conditions such as temperature, etc.

Particular embodiments of the thiolate-bridged multinuclear copper(I) complex will be described herein below. The thiolate-bridged multinuclear copper(I) complex may, however, be embodied in different forms.

The thiolate-bridged multinuclear copper(I) complex represented by Formula (1) may include two (2) copper atoms (a=2 in Formula (1)) as the central metal thereof. The thiolate-bridged multinuclear copper(I) complex may be one of Compounds 1 to 9 represented below.

1

2

3

4

5

6

7

8

9

The thiolate-bridged multinuclear copper(I) complex represented by Formula (1) may include three (3) copper atoms (a=3 in Formula (1)) as the central metal thereof. The thiolate-bridged multinuclear copper(I) complex may be one of Compounds 10 to 12 represented below.

10

11

12

The thiolate-bridged multinuclear copper(I) complex represented by Formula (1) may include four (4) copper atoms (a=4 in Formula (1)) as the central metal thereof. The thiolate-bridged multinuclear copper(I) complex may be one of Compounds 13 to 17 represented below.

13

14

15

16

-continued

17

The thiolate-bridged multinuclear copper(I) complex represented by Formula (1) may include six (6) copper atoms (a=6 in Formula (1)) as the central metal thereof. The thiolate-bridged multinuclear copper(I) complex may be one of Compounds 18 to 19 represented below.

18

19

The following Examples and Comparative Examples are provided in order to highlight characteristics of one or more embodiments, but it will be understood that the Examples and Comparative Examples are not to be construed as limiting the scope of the embodiments, nor are the Comparative Examples to be construed as being outside the scope of the embodiments. Further, it will be understood that the embodiments are not limited to the particular details described in the Examples and Comparative Examples.

SYNTHETIC EXAMPLES

As synthetic examples of the thiolate-bridged multinuclear copper(I) complex,
Compound 17 which is a 4 nuclei thiolate-bridged multinuclear copper(I) complex, Compound 19 which is a 6 nuclei thiolate-bridged multinuclear copper(I) complex, and Compound 8 which is a 2 nuclei thiolate-bridged multinuclear copper(I) complex will be explained. The synthetic method may, however, be embodied in different forms.

Synthesis of $[Cu_4(PPh_3S)_4(CH_3CN)_2]$ 20 ml of $CH_3CN$ was added in 19.6 mg (0.103 mmol) of CuI, and argon bubbling was performed for 30 minutes. Then, 30.5 mg (0.102 mmol) of $PPh_3SH$ and 14.1 µl of triethylamine were added thereto, followed by argon bubbling for 5 minutes. The reactant was stirred overnight under an argon atmosphere, and a precipitated solid was separated by suction filtering to obtain 32.1 mg of a light green powder. The X-ray structure of the powder was analyzed, and the target product was identified.

Figure 1:
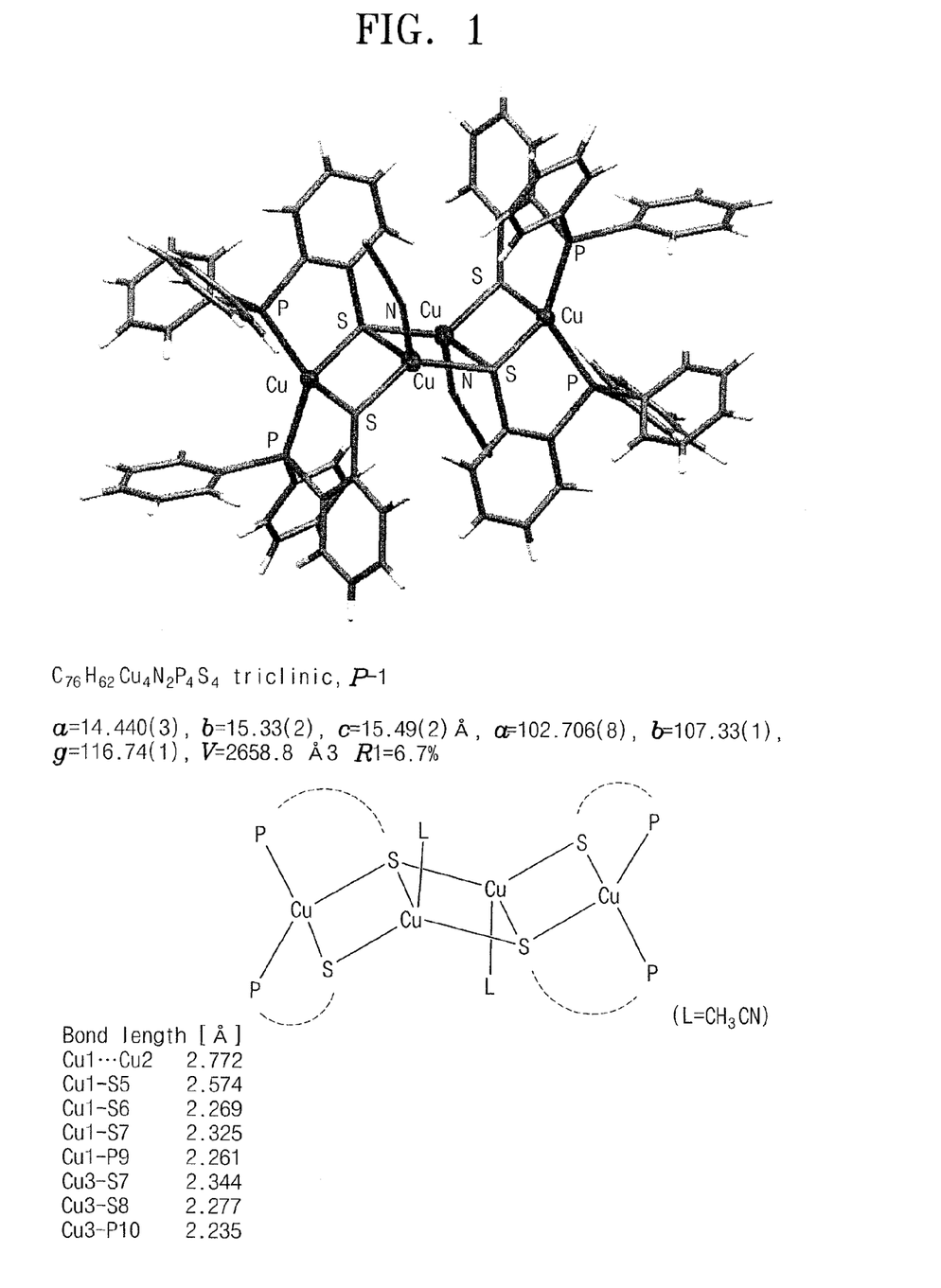
FIG. 1 illustrates a molecular structure of a cooper(I) complex, and results of an X-ray analysis thereof, according to an embodiment.

For the X-ray structure analysis, data were measured by using a Rigaku ARC-7R Mercury Single Crystal X-ray Diffractometer. The temperature for measuring was set to −200K. The results of the X-ray analysis are illustrated in FIG. 1.

Figure 2:
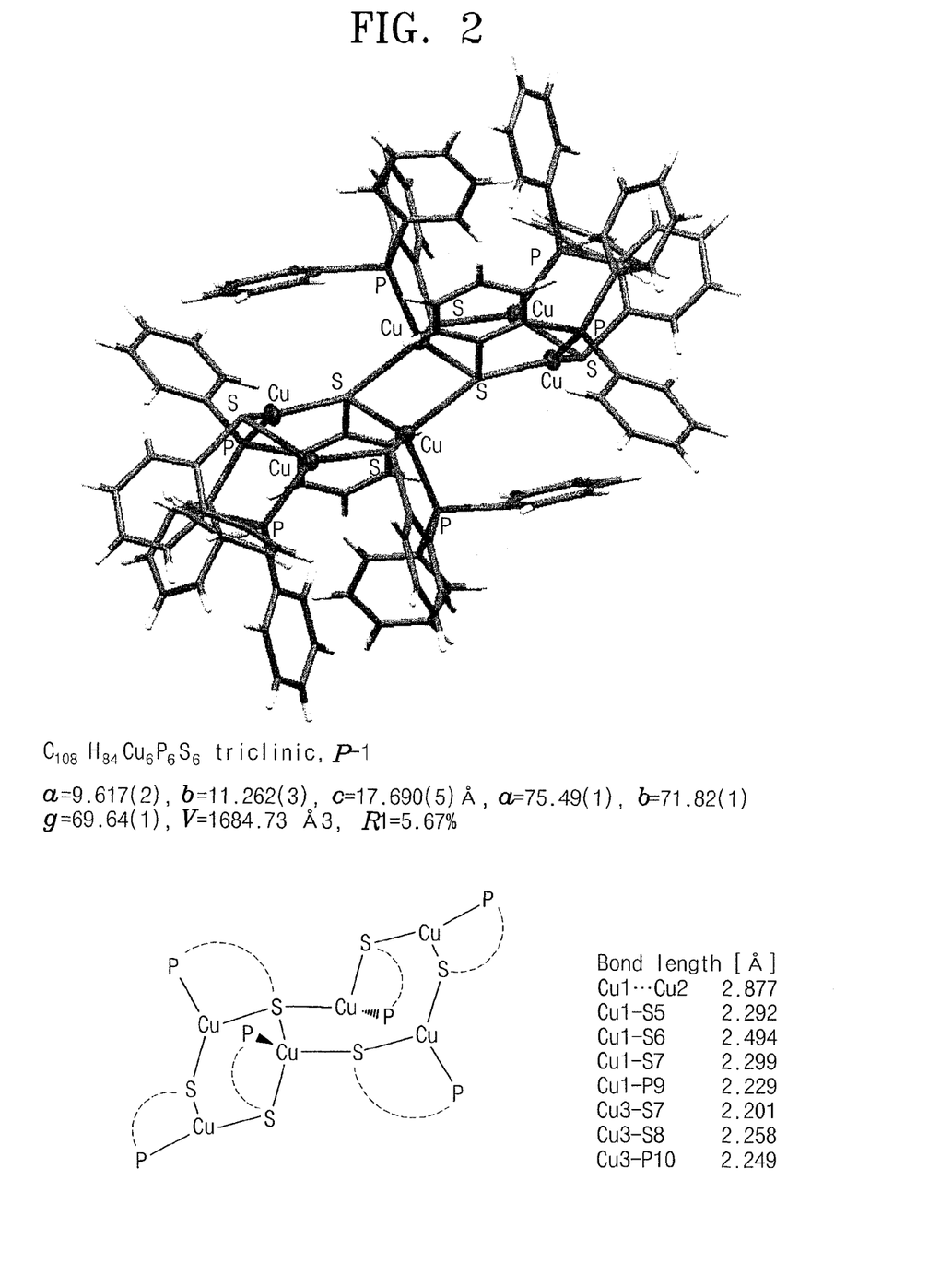
FIG. 2 illustrates a molecular structure of a copper(I) complex, and results of an X-ray analysis thereof, according to another embodiment.

Synthesis of $[Cu_6(PPh_3S)_6]$ 20 ml of $CH_3CN$ was added in 19.6 mg (0.103 mmol) of CuI, and argon bubbling was performed for 30 minutes. Then, 30.5 mg (0.102 mmol) of $PPh_3SH$ and 14.1 µl of triethylamine were added thereto, followed by argon bubbling for 5 minutes. The reactant was stirred overnight under an argon atmosphere, and a precipitated solid was separated by suction filtering to obtain 32.1 mg of a light green powder. The light green powder was slowly crystallized using liquid-liquid diffusion of THF/hexane to obtain a yellow crystal. The X-ray structure of the crystal was analyzed, and the target product was identified. For the X-ray analysis, data were measured by using AFC-8 Mercury of RF-AR NW2A of high Energy Accelerator Research Organization. The temperature for measuring was set to −200K. The results of the X-ray analysis are illustrated in FIG. 2.

Figure 3:
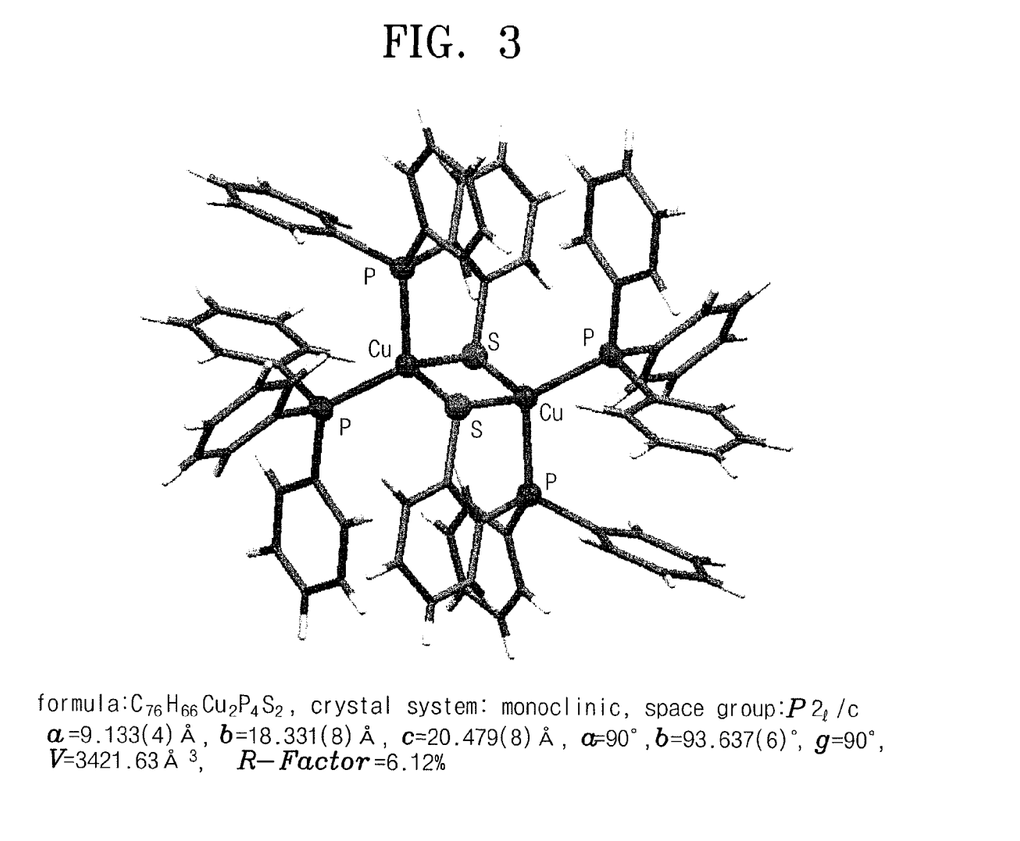
FIG. 3 illustrates a molecular structure of a copper(I) complex, and results of an X-ray analysis thereof, according to another embodiment.

Synthesis of $[Cu_2(PPh_3S)_2(PPh_3)_2]$ 24.0 mg (0.016 mmol) of $[Cu_4(PPh_3S)_4(CH_3CN)_2]$ and 17.0 mg (0.065 mmol) of $PPh_3$ were dissolved in 8 ml of THF, and argon bubbling was performed. By liquid diffusion with hexane, a yellow crystal was obtained. The X-ray structure of the crystal was analyzed, and the target product was identified. For the X-ray structure analysis, data were measured by using Rigaku ARC-7R Mercury Single Crystal X-ray Diffractometer. The temperature for measuring was set to −200K. The results of the X-ray analysis are illustrated in FIG. 3.

With respect to $[Cu_4(PPh_3S)_4(CH_3CN)_2]$, $[Cu_6(PPh_3S)_6]$ and $[Cu_2(PPh_3S)_2(PPh_3)_2]$ thus produced in the syntheses in order, emission properties were measured.

Figure 4:
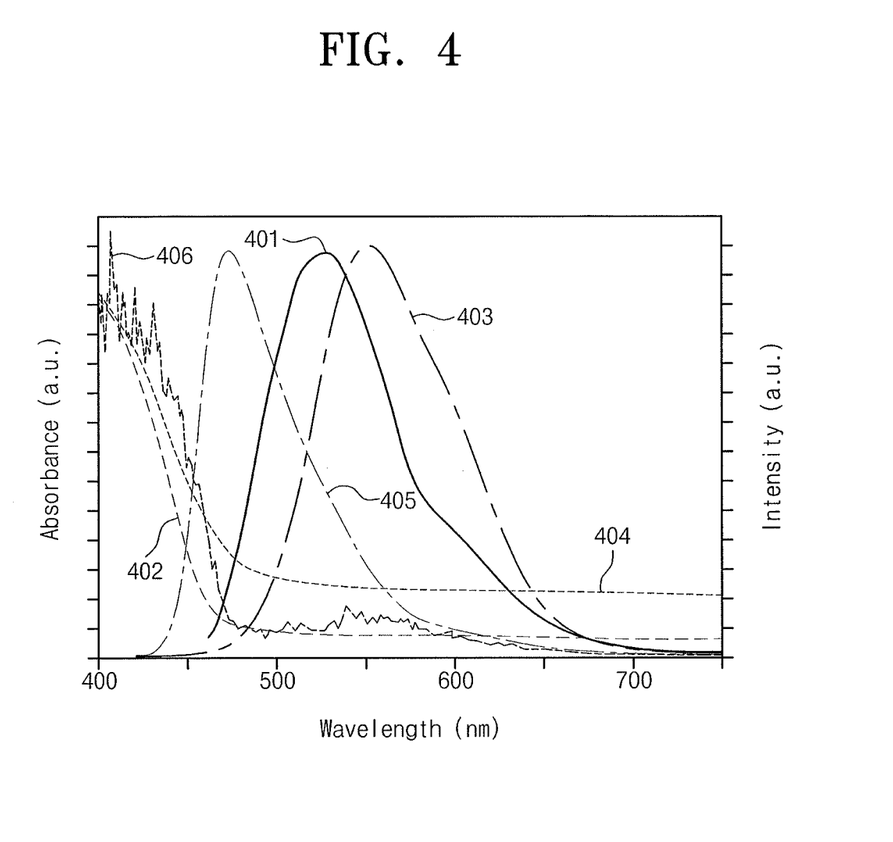
FIG. 4 illustrates the emission properties of copper(I) complexes according to embodiments.

The results are illustrated in FIG. 4. In FIG. 4, 401 corresponds to the emission wavelength of $[Cu_4(PPh_3S)_4(CH_3$ CN)₂], 402 corresponds to the absorption wavelength of [Cu₄(PPh₃S)₄(CH₃CN)₂], 403 corresponds to the emission wavelength of [Cu₆(PPh₃S)₆], 404 corresponds to the absorption wavelength of [Cu₆(PPh₃S)₆], 405 corresponds to the emission wavelength of [Cu₂(PPh₃S)₂(PPh₃)₂], and 406 corresponds to the absorption wavelength of [Cu₂(PPh₃S)₂(PPh₃)₂]. The emission properties were measured by using the solid powders of [Cu₄(PPh₃S)₄(CH₃CN)₂] and [Cu₆(PPh₃S)₆], by providing excited light to about 400 nm at room temperature, using a FR-6600 fluorescence spectrophotometer of Japanese Spectrum.

Referring to the results in FIG. 4, [Cu₄(PPh₃S)₄(CH₃CN)₂] exhibited good emission properties near 500 to 550 nm, [Cu₆(PPh₃S)₆] exhibited good emission properties near 550 to 600 nm, and [Cu₂(PPh₃S)₂(PPh₃)₂] exhibited good emission properties near 450 to 500 nm.

As described above, the thiolate-bridged multinuclear copper(I) complex represented by Formula (1) may have a stable structure and good emission properties. Thus, the thiolate-bridged multinuclear copper(I) complex may be appropriately used as a phosphorescent emission material in an organic EL device.

By way of summation and review, an organic emission material used in an emission layer of an organic EL device may be a phosphorescent emission material that may emit light at a triplet excited state. Quantum efficiency may be markedly improved by using the phosphorescent emission material in the emission layer of an organic EL device, and thus, emission efficiency of the organic EL device may be improved. As the phosphorescent emission material, metal complexes of a heavy atom such as platinum, rhodium, and ruthenium including iridium with a coordinated organic ligand may be used. Such metal complexes, which include the above-described precious metals, have disadvantages of being expensive.

Embodiments provide a copper(I) complex including copper, which is cheaper than the above-described precious metals.

Embodiments provide provides a thiolate-bridged multinuclear copper(I) complex having excellent stability.

Embodiments provide a copper(I) complex that allows the wavelength of emitted light to be changes by lowering the energy level of a π* orbital.

Embodiments provide a thiolate-bridged multinuclear copper(I) complex having a structure with good durability and stability when used as an emission material of an organic EL device.

Example embodiments have been disclosed herein, and although specific terms are employed, they are used and are to be interpreted in a generic and descriptive sense only and not for purpose of limitation. Accordingly, it will be understood by those of skill in the art that various changes in form and details may be made without departing from the spirit and scope thereof as set forth in the following claims.

What is claimed is:

1. A copper(I) complex represented by following Formula (1):

$$[Cu_a(XS)_b(L)_c] \quad (1)$$

wherein, L is acetonitrile, tri-iso-butylphosphine, tricyclohexylphosphine or a substituted or unsubstituted heterocyclic compound represented by Formulae (2) to (14):

(2)

(3)

(4)

(5)

(6)

(7)

(8)

(9)

(10)

(11)

(12)

(13)

(14)

a is an integer from 2 to 6, b is an integer from 2 to 6, c is an integer from 0 to 6, X is a substituted or unsubstituted carbazole, or PR$_3$, where R is a substituted or unsubstituted phenyl group or a substituted or unsubstituted cyclohexyl group.

2. The copper(I) complex as claimed in claim 1, wherein, in Formula (1):

c is an integer from 1 to 6.

3. A copper(I) complex, selected from:

a copper (I) complex of the formula [Cu$_a$(XS)$_b$(L)$_c$] where L is pyridine, a is 2, b is 2, c is 2, and X is triphenylphosphine, a copper (I) complex of the formula [Cu$_a$(XS)$_b$(L)$_c$] where L is acetonitrile, a is 4, b is 4, c is 2, and X is triphenylphosphine, and a copper (I) complex of the formula [Cu$_a$(XS)$_b$(L)$_c$] where a is 6, b is 6, c is 0, and X is triphenylphosphine.

4. A copper(I) complex, the copper(I) complex being selected from Compounds 1 to 7, 9 to 11, 13 to 14, and 16 to 17, below:

1

2

3

4

5

6

10

7

11

8

12

9

13

14

15

16

17

* * * * *